(12) United States Patent
Heilbronner

(10) Patent No.: US 6,881,071 B2
(45) Date of Patent: Apr. 19, 2005

(54) POWER SEMICONDUCTOR MODULE WITH PRESSURE CONTACT MEANS

(75) Inventor: Heinrich Heilbronner, Stein (DE)

(73) Assignee: Semikron Elektronik GmbH, Nuremberg (DE)

(*) Notice: Subject to any disclaimer, the term of this patent is extended or adjusted under 35 U.S.C. 154(b) by 178 days.

(21) Appl. No.: 10/138,034

(22) Filed: May 2, 2002

(65) Prior Publication Data
US 2002/0173192 A1 Nov. 21, 2002

(30) Foreign Application Priority Data
May 5, 2001 (DE) .......................... 101 21 970

(51) Int. Cl.⁷ .............................................. H01R 12/00
(52) U.S. Cl. ........................................................ 439/67
(58) Field of Search .......................................... 439/67

(56) References Cited

U.S. PATENT DOCUMENTS

| | | | | |
|---|---|---|---|---|
| 3,199,067 A | * | 8/1965 | Guy | 439/329 |
| 3,501,832 A | * | 3/1970 | Iwata et al. | 29/840 |
| 4,180,828 A | | 12/1979 | Schermer et al. | |
| 4,657,322 A | * | 4/1987 | Grellmann et al. | 439/77 |

FOREIGN PATENT DOCUMENTS

| | | |
|---|---|---|
| DE | 41 32 947 A1 | 8/1993 |
| DE | 196 48 562 A1 | 4/1998 |
| DE | 199 03 875 A1 | 10/2000 |

* cited by examiner

Primary Examiner—Phuong Dinh
(74) Attorney, Agent, or Firm—Darby & Darby

(57) ABSTRACT

A power semiconductor module consists of a ceramic substrate with electrically conductive contact surfaces arranged thereon in a "circuit-friendly" manner. Components arranged on the substrate in a "circuit-friendly" manner. A pressure contact means, consisting of a flexible pressure accumulator, and a pressure plate produce pressure for resilient bonding of power and control connections. To increase performance, reliability and service life while reducing manufacturing costs, different configuration methods for the individual components are absolutely essential. This is achieved by a flexible circuit board which connects components with each other in a circuit-friendly manner and/or with the contact surfaces of the substrate, whereby a flexible insulation material is provided to insulate components from each other.

11 Claims, 2 Drawing Sheets

POWER SEMICONDUCTOR MODULE WITH PRESSURE CONTACT MEANS

BACKGROUND

The invention relates to a power semiconductor module with active and/or passive components. In particular, the present invention relates to a power converter module.

Several such power semiconductor modules are known from the literature. To increase performance, reliability and service life while reducing manufacturing costs, different configuration methods for the individual components are absolutely essential.

Modern power semiconductor modules, which are the starting point of this invention, are modules without base plate, as described, for example, in DE 199 03 875 A1, consisting of:
a housing;
a ceramic substrate with metal coatings arranged on same in a "circuit-friendly" manner, which is produced, for example, according to the DCB (direct copper bonding) method;
components such as diodes, transistors, resistors or sensors, are directly bonded to this substrate by soldering;
bonding to connect the structured side of the components to other components, the substrate and/or connecting elements leading to the outside;
a sealing compound preferably consisting of a material such as silicone rubber for insulating the individual components from each other.

In such power semiconductor modules, configurations providing pressure contact means for facilitating thermal contact of the module with a heat sink have proven very advantageous. It was found that it is very difficult to control the quality of soldering joints, particularly those with a large surface. Variable joint quality is detrimental to the reliability and service life of the power semiconductor modules.

Pressure buildup in such pressure-contacted power semiconductor modules is achieved using a mechanically stable pressure plate. Depending on further developments, the generated pressure can be transmitted to the substrate by special designs of the pressure plate, such as shown in DE 196 48 562 C1, or by an elastic pressure accumulator according to DE 199 03 875 A1.

Known from DE 41 32 947 A1 are flexible circuit boards and the use of electrically conducting and/or insulating pastes in power semiconductor modules. These are used as substitutes for the ceramic 2 substrates and for joints between the components.

U.S. Pat. No. 4,180,828 discloses the connection between a component and the conductive strips of a substrate via a flexible film. The electrical contact between the film and the component or between the film and the conductive strips is established by soldering or adhesive bonding.

The manufacturing methods according to DE 196 48 562 C1 or DE 199 03 875 A1 have the disadvantages that, as customary in modern modules, a large number of components must be contacted with each other and/or with the substrate. This is achieved by means of a large number of individual bonded joints. It is quite common to see up to 10 bonded joints per component. Since these bonding joints are produced in series, this process is quite time-consuming, with the result that producing them accounts for a substantial portion of the manufacturing cost of the modules.

The manufacturing method according to DE 41 32 947 A1 involves a sometimes extremely complex layer design and also requires the continued use of classical soldering joints. It therefore does not ensure the efficient configuration of power semiconductor modules.

In accordance with U.S. Pat. No. 4,180,828, the flexible film is applied either to the component or the conductive strips of the substrate by soldering or adhesive bonding. The practical production of such soldering joints is difficult because the introduction of heat through the film requires special techniques to prevent the film from being damaged and/or destroyed.

OBJECTS AND SUMMARY OF THE INVENTION

It is an object of the present invention to create a power semiconductor module which can at least partly eliminate the need for bonding and/or soldering joints between the individual semiconductor components or between semiconductor components and various contact surfaces such as those of the substrate.

It is a further object of the invention to provide a power semiconductor module having at least the same quality as prior art devices in terms of service life and reliability, and which is cost-effective to manufacture.

It is a still further object of the invention to simplify the insulation of the individual components from each other.

The above objects are achieved through measures disclosed herein.

A circuit board as described below is defined not only as a substantially rigid construction, but also as modern flexible developments such as are also described in prior art. These will be called "flexible circuit boards" below, and they are characterized by a design which includes various conductive strips insulated from each other and from the surface as well as contact surfaces not insulated from the surface for electrical contacting.

To manufacture power semiconductor modules cost-effectively while ensuring their high reliability and service life, it is necessary to replace particularly complex production steps by simpler solutions that can be accomplished faster. It is particularly time-consuming to provide power semiconductor modules with the semiconductor components and then subsequently to wire them in a circuit-friendly manner by bonding joints.

The inventive configuration of circuit-friendly wiring is at least partly achieved by a flexible circuit board instead of bonding joints. Bonding joints are produced serially, while a connection by means of a flexible circuit board requires only a single operation that is quick to accomplish. In view of the above-described disadvantages of direct bonds, especially of soldering joints, their use is limited to a minimum number of applications. There are two equivalent alternative solutions.

The semiconductor components are applied to the contact surfaces of the ceramic substrate by direct bonding, whereby these contact surfaces are designed in such a way that circuit-friendly connections can be achieved between the individual semiconductor components. For example, the direct bonding can be accomplished through soldering or a more modern adhesion process which also partly allows for flexible connections. The remaining circuit-friendly wiring of the semiconductor components with each other as well as with other contact surfaces of the substrate is achieved by the flexible circuit board. This circuit board is firmly bonded with pressure contact means between the module and the first main surfaces of the semiconductor components. In prior art, such pressure contact means consist of a pressureaccumulating element and a pressure plate that introduces the pressure into the system. The pressure necessary for contacting is produced only by connecting the power semiconductor module to the heat sink. Thus, the complete and reliable electrical contact of the power semiconductor module is achieved simultaneously with its thermal contact on the heat sink.

As a second version according to the invention it is possible to fasten the semiconductor components by direct bonding, preferably by an adhesive process, to the flexible circuit board. Circuit-friendly connections on the substrate as well as in the flexible circuit board are accomplished in a similar manner as with the first version. By applying the flexible circuit board provided with the semiconductor components to the substrate, the complete circuit-friendly wiring of the semiconductor module is established. The complete functionality of the wiring is achieved only with the above described pressure contact means including the thermally conductive contact with the heat sink.

Mixed forms of the two solutions may be advantageous for specific applications.

Both solutions have the same advantageous characteristic that firm electrically conductive bonding is achieved through pressure contact which already exists in the power semiconductor module for the thermal contact on the heat sink.

Furthermore, the flexible circuit board can serve, at least partly, to contact the external power and/or control connections. In this case, connections by firm and/or direct bonding are conceivable. In case of a firmly bonded version, pressure contact of the power semiconductor module may also ensure a durable bond, i.e., a durably secure contact.

The inventive design of the insulation of the individual components from each other is accomplished by a flexible insulation material. This insulation material may have a pasty or foam-like structure. Preferably, the insulation material is applied to the first main surfaces and the spaces between the components.

Subsequently, in the further manufacturing process of the inventive power semiconductor modules, the flexible circuit board is applied. On this circuit board, on the side facing the first main surface of the components, nodules are provided in such a way that a circuit-friendly connection is ensured. Due to the application of pressure, the nodules displace the insulation material at the points where contacting is necessary. Surplus insulation material from the area between the substrate provided with components and the flexible circuit board is pressed out through suitable recesses. Thus, pressure contact ensures that, on the one hand, a secure electrical contact is established between the components or contact surfaces of the substrate and the flexible circuit board, and that on the other hand, the space between the substrate provided with components and the flexible circuit board is completely filled with insulation material. This ensures insulation between the individual components.

Briefly stated, the present invention provides a power semiconductor module which consists of a ceramic substrate with electrically conductive contact surfaces arranged thereon in a "circuit-friendly" manner. Components arranged on the substrate in a "circuit-friendly" manner. A pressure contact means, consisting of a flexible pressure accumulator, and a pressure plate produce pressure for resilient bonding of power and control connections. To increase performance, reliability and service life while reducing manufacturing costs, different configuration methods for the individual components are absolutely essential. This is achieved by a flexible circuit board which connects components with each other in a circuit-friendly manner and/or with the contact surfaces of the substrate, whereby a flexible insulation material is provided to insulate components from each other.

According to an embodiment of the invention, there is provided a power semiconductor module for mounting in a housing, comprising: a ceramic substrate, contact surfaces arranged on the ceramic substrate in a circuit-friendly manner, components arranged on the ceramic substrate, a pressure contact means consisting of a flexible pressure accumulator and a pressure-generating pressure plate, the pressure contact means further including power and control connections, a flexible circuit board contacting the components, the flexible circuit board being disposed at least partly above a first main surface of the ceramic substrate, the flexible circuit board including conductive strips and contact surfaces, whereby the flexible circuit board connects components with at least one of each other and contact surfaces of the substrate in a circuit-friendly manner, thus forming the circuit-friendly electrical connection of the module whereby the flexible circuit board forms the circuit-friendly connection with contact surfaces of at least one external circuit board.

According to a feature of the invention, there is provided a power semiconductor module for mounting in a housing, comprising: a ceramic substrate, structured and electrically conductive contact surfaces on the ceramic substrate in a circuit-friendly manner, components in the contact surfaces, a circuit board electrically connecting at least one of the components, a pressure contact means, the pressure contact means including a flexible pressure accumulator and a pressure generating pressure plate, as well as power and control connections, a flexible insulation material for insulation of components from each other, and nodule-like elevations penetrating the flexible insulation material to provide contact between the circuit board and the components, whereby upon application of pressure by the pressure contact means a secure electrically conductive connection is established.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENT

In the following, housings are omitted from illustration and description for purposes of clarity of description.

Figure 1:
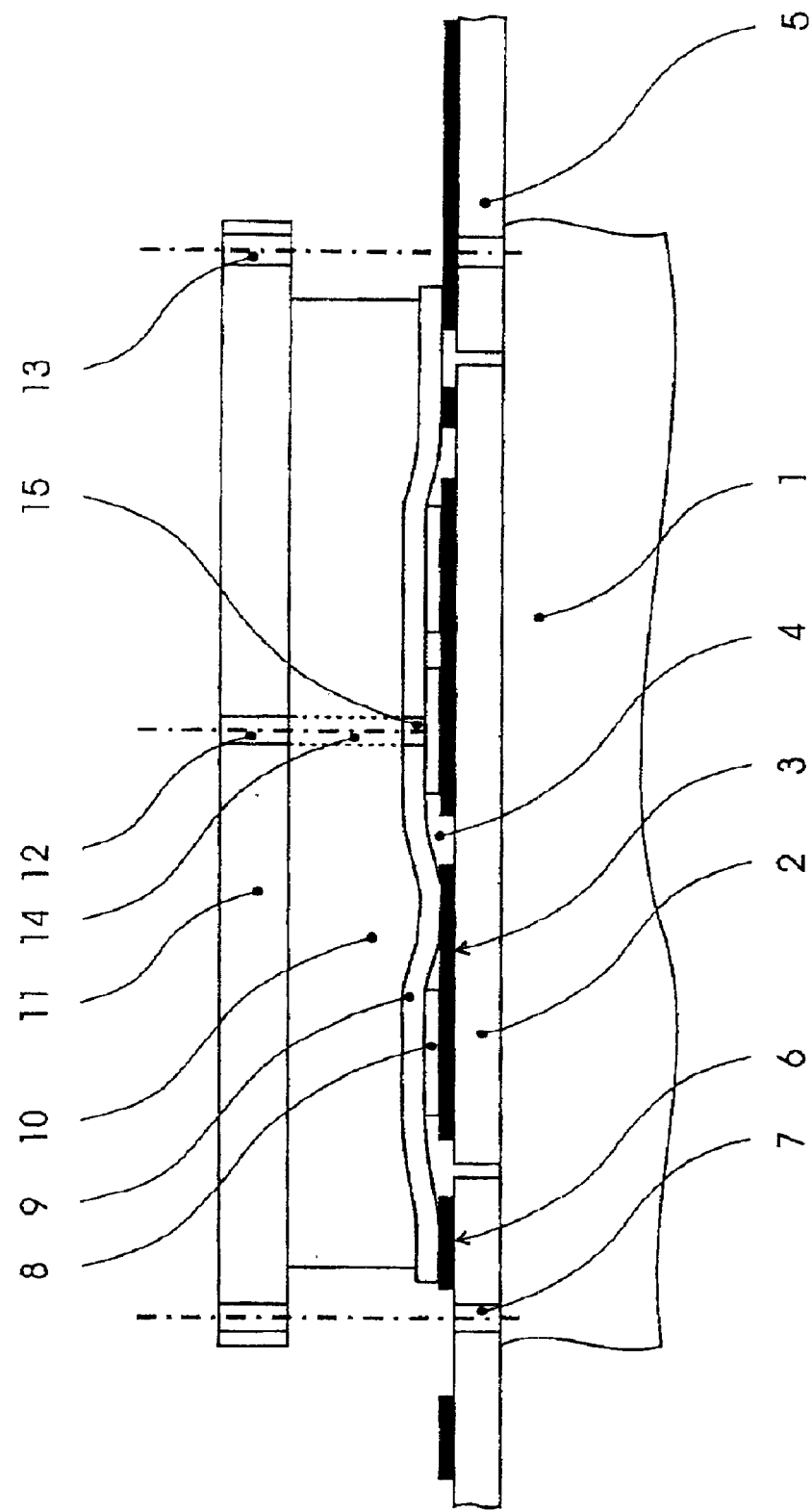
FIG. 1 is a cross section of a power semiconductor module according to an embodiment of the invention.
Figure 2:
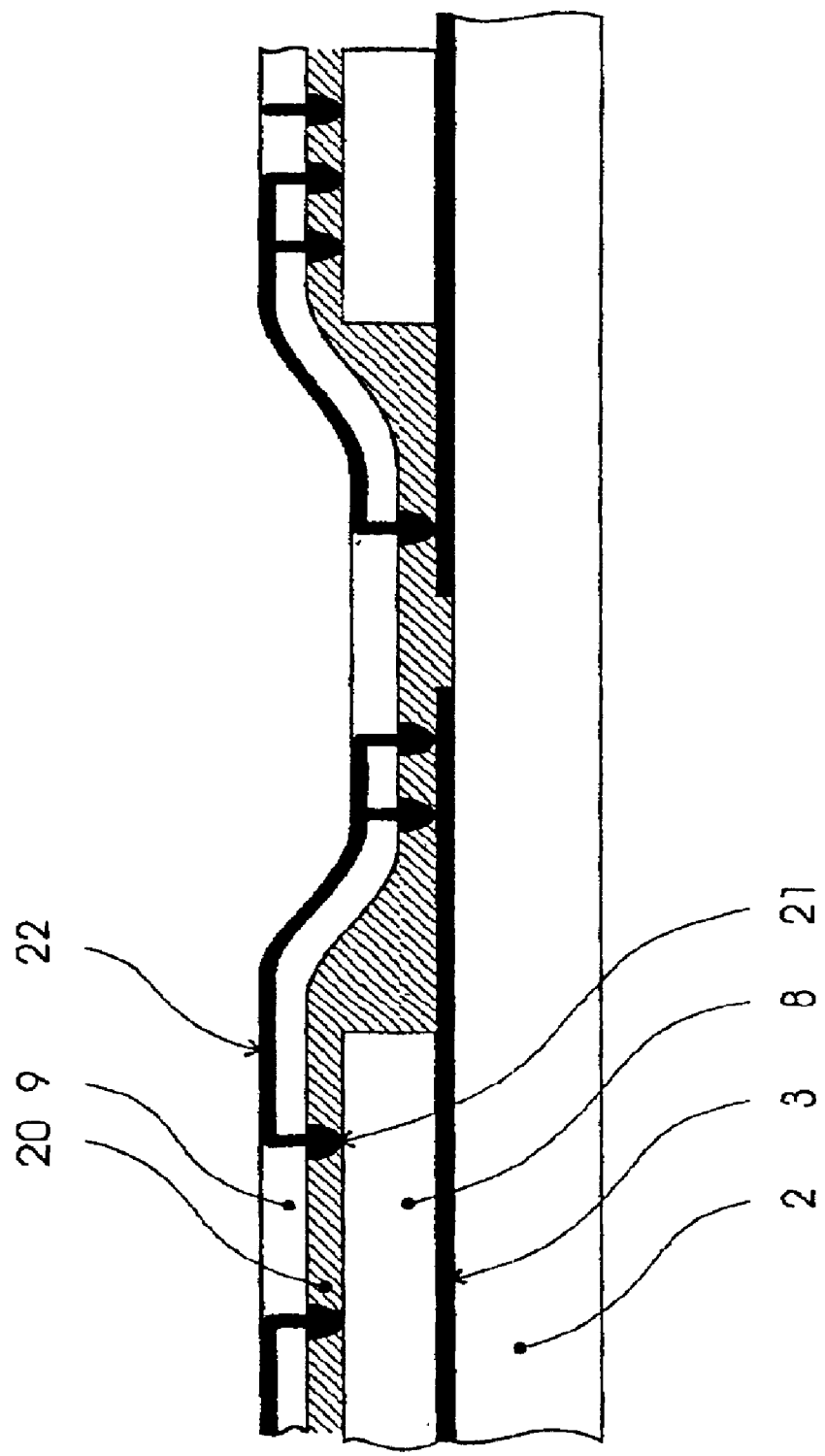
FIG. 2 is an enlarged portion of the power semiconductor module of FIG. 1.

Referring to FIGS. 1 and 2, a heat sink 1 is connected to a preferably ceramic substrate 2 in a manner that permits thermal conductivity therebetween. The thermal conductivity is accomplished by a thermally conductive paste (not shown) and a flat metal lamination (also not shown) of the second main surface of substrate 2. This technique has proven extremely successful for removing heat dissipated by performance class semiconductor modules.

A first main surface of ceramic substrate 2 is electrically insulated from the heat sink 1. The first main surface includes contact surfaces 3 designed as metallic laminations. Semiconductor components 8 are disposed on these contact surfaces 3 of substrate 2. The contact surfaces 3 are designed in such a way that a circuit-friendly connection is established with second main surfaces (facing the substrate) of components 8 to be placed thereon.

In a first embodiment of the inventive solution, the semiconductor components 8 are connected to contact means 3 by direct bonding. This direct bond is established preferably by soldering. The soldering methods used must allow the soldering of all semiconductor components in one operation. According to the invention, the circuit-friendly connection between the first main surfaces (facing away from the ceramic) of the semiconductor components is achieved by a flexible circuit board 9. This flexible circuit board 9 is connected to the first main surfaces of the semiconductor components not by direct bonding but by resilient pressure bonding. A durable and reliable electrical contact is achieved only after pressure contact of the overall configuration.

In this embodiment, the contact surfaces of the flexible circuit board 9 for contacting the semiconductor components 8 are preferably provided with nodule-like elevations 21. On the one hand, these nodules provide a secure contact means, on the other hand they ensure the efficient pressure contact of the entire power semiconductor module.

In another possible embodiment of the invention, the first main surfaces of the semiconductor components 8 are connected by direct bonding to the flexible circuit board 9. This connection is preferably established by an electrically conductive adhesive. A soldering bond is conceivable as well. The bond consisting of the flexible circuit board 9 and the semiconductor components 8 is applied to substrate 2 in the manufacturing process in such a way that the second main surfaces of the semiconductor components come to lie on the contact surfaces 3 of substrate 2 so that a circuit-friendly contact means is established. A durable and reliable electrical contact with contact surfaces 3 of substrate 2 is only achieved after pressure contacting of the overall configuration.

The contact of power and control connections necessary for power semiconductor modules can also be achieved by the flexible circuit board 9. For this purpose, for example, the externally provided connections are bonded directly by the flexible circuit board 9 to at least one rigid or flexible circuit board 5 containing contact means 6, firmly bonded to the corresponding connections of the power semiconductor module through the pressure contact means in the power semiconductor module. The flexible circuit boards 5, which do not necessarily have the same thickness as substrate 2, are electrically insulated and at least partially placed by their second main surface on heat sink 1. For the purpose of contacting the external power and control connections of circuit board 5, flexible circuit board 9 has a suitable size and shape to cover circuit board 5 in such a way that an at least partial electrical contact exists between the corresponding contact surfaces of flexible circuit board 9 and contact surfaces 6 of the external circuit board 5.

All firmly bonded contacts are durably and reliably closed only after pressure is applied by an elastic pressure accumulator 10 and a rigid pressure plate 11 introducing the pressure. For example, a screw connection can be used to introduce the pressure. For these screw connections, passages 7, 13, 14, 15 are provided in pressure plate 11, and if necessary also in pressure accumulator 10, substrate 2 and/or external circuit boards 5. Thus, the thermally conductive and electrically insulating contact between the power semiconductor module and heat sink 1, as well as all electrically conductive firmly bonded contacts are established during mounting on a heat sink.

Passages 12 can be provided to allow further power and/or control connections with flexible circuit board 9, the semiconductor components 8 and/or contact surfaces 3 of substrate 2.

The spaces 4 between substrate 2 and flexible circuit board 9 can be filled with a prior-art dielectric such as silicone rubber, to protect against electrical arcing.

One inventive embodiment of the insulation between individual components uses a pasty insulation material 20 which is flatly applied to the bond established between the semiconductor components 8 and contact surfaces 3 of substrate 2. The flexible circuit board 9 placed above this pasty insulation material, then is urged in the direction of substrate 2 with a pressure contact means consisting of pressure plate 11 and pressure accumulator 10. For electrically contacting the flexible circuit board 9 with the contact surfaces of the semiconductor components 28 or the contact surfaces 3 of substrate 2, nodules 21 displace the insulation material contained in that region. Thus, an electrical contact is established that remains stable over a long period. Furthermore, due to this pressure contact, the entire (or if required, a partial) remaining space between flexible circuit board 9 and substrate 2 with semiconductor components 8 is filled with the insulation material. Any surplus insulation material is displaced through appropriate recesses or at the edges of the power semiconductor module.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A power semiconductor module for mounting in a housing, comprising: a ceramic substrate;
   contact surfaces arranged on said ceramic substrate in a circuit-friendly manner;
   components arranged on said ceramic substrate;
   a pressure contact means consisting of a flexible pressure accumulator and a pressure-generating pressure plate;
   said pressure contact means further including power and control connections;
   a flexible circuit board contacting said components;
   said flexible circuit board being disposed at least partly above a first main surface of said ceramic substrate;
   said flexible circuit board including conductive strips and contact surfaces, whereby said flexible circuit board connects said components with at least one of each other and contact surfaces of said substrate in said circuit-friendly manner, thus forming said circuit-friendly electrical connection of said module whereby said flexible circuit board forms said circuit-friendly connection with contact surfaces of at least one external circuit board.

2. A power semiconductor module for mounting in a housing, comprising:
   a ceramic substrate;
   structured and electrically conductive contact surfaces on said ceramic substrate in a circuit-friendly manner;
   components in said contact surfaces;

a circuit board electrically connecting at least one of said components;

a pressure contact means;

said pressure contact means including a flexible pressure accumulator and a pressure generating pressure plate, as well as power and control connections;

a flexible insulation material for insulation of components from each other; and nodule-like elevations penetrating said flexible insulation material to provide contact between said circuit board and said components, whereby upon application of pressure by said pressure contact means a secure electrically conductive connection is established.

3. A power semiconductor module according to claim 1, wherein:

at least one component is directly and firmly bonded to contact surfaces of said substrate, in an electrically conductive manner with at least one contact surface of said flexible circuit board by pressure contact.

4. A power semiconductor module according to claim 1, wherein:

at least one component is directly bonded in an electrically conductive manner to at least one contact surface of flexible circuit board;

said at least one component is directly bonded in an electrically conductive manner with at least one contact surface of said flexible circuit board; and direct bonding is firmly established with at least one contact surface of said substrate by pressure contact.

5. A power semiconductor module according to claim 1, wherein said components include at least one of power diodes, power thyristors, power transistors, sensors, resistors and integrated circuits.

6. A power semiconductor module according to claim 3, wherein directly bonded contact is established by soldering.

7. A power semiconductor module according to claim 3, wherein directly bonded contact is established by an adhesive bond using an electrically conductive adhesive.

8. A power semiconductor module according to claim 1, wherein the flexible circuit board forms at least part of contact between at least one of power and control contacts of said power semiconductor module and contact surfaces of at least one external circuit board.

9. A power semiconductor module according to claim 8, wherein said contact are formed at least in part as a firm bond, through at least one of soldering adhesion.

10. A power semiconductor module according to claim 8, wherein said contact of said power and/or control connections are formed at least in part as a firm bond, through said pressure contact means.

11. A power semiconductor module according to claim 2, wherein said flexible insulation material has one of a pasty or foam-like structure.

* * * * *

UNITED STATES PATENT AND TRADEMARK OFFICE
CERTIFICATE OF CORRECTION

PATENT NO. : 6,881,071 B2
DATED : April 19, 2005
INVENTOR(S) : Heinrich Heilbronner It is certified that error appears in the above-identified patent and that said Letters Patent is hereby corrected as shown below:

Title page,
Item [73], Assignee, please delete "Semikron Elektrnik GmbH, Nuremberg (DE)" and substitute with -- Semikron Elektronik GmbH, Nurnberg (DE) --.

Signed and Sealed this

Fifth Day of July, 2005

JON W. DUDAS
*Director of the United States Patent and Trademark Office*